(12) United States Patent
Dieny

(10) Patent No.: US 8,208,295 B2
(45) Date of Patent: Jun. 26, 2012

(54) HEAT ASSISTED MAGNETIC WRITE ELEMENT

(75) Inventor: Bernard Dieny, Lans en Vercors (FR)

(73) Assignees: Commissariat a l'Energie Atomique et Aux Energies Alternatives, Paris (FR); Centre National de la Recherche Scientifique, Paris (FR)

(*) Notice: Subject to any disclaimer, the term of this patent is extended or adjusted under 35 U.S.C. 154(b) by 0 days.

(21) Appl. No.: 12/905,346

(22) Filed: Oct. 15, 2010

(65) Prior Publication Data

US 2011/0044099 A1  Feb. 24, 2011

Related U.S. Application Data

(63) Continuation of application No. PCT/IB2009/051715, filed on Apr. 27, 2009.

(60) Provisional application No. 61/057,943, filed on Jun. 2, 2008.

(30) Foreign Application Priority Data

May 6, 2008 (FR) ...................................... 08 52996

(51) Int. Cl.
  *G11C 11/14* (2006.01)
(52) U.S. Cl. ........................................ 365/171; 365/158
(58) Field of Classification Search .................. 365/171, 365/158
See application file for complete search history.

(56) References Cited

U.S. PATENT DOCUMENTS

| 5,583,725 A | 12/1996 | Coffey et al. |
| 5,640,343 A | 6/1997 | Gallagher et al. |
| 6,021,065 A | 2/2000 | Daughton et al. |
| 6,385,082 B1 | 5/2002 | Abraham et al. |
| 6,603,677 B2 | 8/2003 | Redon et al. |
| 6,791,805 B2* | 9/2004 | Heinonen et al. ........ 360/324.11 |
| 6,865,104 B2* | 3/2005 | Perner ........................... 365/158 |
| 7,643,332 B2* | 1/2010 | Leuschner .................... 365/158 |

(Continued)

FOREIGN PATENT DOCUMENTS

FR  2 817 999 A1  6/2002

(Continued)

OTHER PUBLICATIONS

Chih-Huang Lai et al., "Thermally Assisted-Writing Giant Magnetoresistance with Perpendicular Magnetization," Journal of Applied Physics, vol. 97, No. 10, May 4, 2005, pp. 10C511-1 to 10C511-3.

(Continued)

*Primary Examiner* — Michael Tran
(74) *Attorney, Agent, or Firm* — Burr & Brown

(57) ABSTRACT

A magnetic element for writing by thermally assisted magnetic field or thermally assisted spin transfer comprises a stack consisting of a free magnetic layer, also called storage layer or switchable magnetization layer, of which the magnetization direction is switchable between two nonwrite stable states, both directed out-of-plane and substantially perpendicular to the plane of said layer, and of which the magnetization is spontaneously reoriented from substantially perpendicular to the plane to substantially in the plane under the effect of the rise in temperature during the writing, at least one reference magnetic layer, called pinned layer, of which the magnetization is oriented substantially perpendicular to the plane of said layer, a nonmagnetic spacer inserted between the two layers and means for making an electric current flow perpendicular to the plane of said layers.

25 Claims, 4 Drawing Sheets

U.S. PATENT DOCUMENTS

| | | | |
|---|---|---|---|
| 2004/0095801 A1 | 5/2004 | Stipe | |
| 2005/0002228 A1 | 1/2005 | Dieny et al. | |
| 2006/0098353 A1 | 5/2006 | Fukuzawa et al. | |
| 2007/0263434 A1 | 11/2007 | Dieny et al. | |
| 2008/0031035 A1 | 2/2008 | Rodmacq et al. | |
| 2008/0151615 A1 | 6/2008 | Rodmacq et al. | |

FOREIGN PATENT DOCUMENTS

| | | | |
|---|---|---|---|
| FR | 2 832 542 A1 | 5/2003 | |
| FR | 2 860 910 A1 | 4/2005 | |
| FR | 2 904 724 A1 | 2/2008 | |
| FR | 2 910 716 A1 | 6/2008 | |
| WO | 03/043017 A2 | 5/2003 | |
| WO | 2005/036559 A1 | 4/2005 | |

OTHER PUBLICATIONS

J. Sort et al., "*Using Exchange Bias to Extend the Temperature Range of Square Loop Behavior in [Pt/Co] Multilayers with Perpendicular Anisotropy*," Applied Physics Letters, vol. 87, No. 24, Dec. 6, 2005, pp. 242504-1 to 242504-3.

P.J. Jensen et al., "*Direction of the Magnetization of Thin Films and Sandwiches as a Function of Temperature*," Physical Review B, vol. 42, No. 1, Jul. 1, 1990, pp. 849-855.

Chao-Cheng Lin et al., "*Thickness Dependence of Co Anisotropy in TbFe/Co Exchange-Coupled Bilayers*," Journal of Applied Physics, vol. 95, No. 11, Jun. 1, 2004, pp. 6846-6848.

Y. Saito et al., "*Bias Voltage and Annealing-Temperature Dependences of Magnetoresistance Ratio in Ir-Mn Exchange-Biased Double Tunnel Junctions*," Journal of Magnetism and Magnetic Materials, vol. 223, 2001, pp. 293-298.

J. M. Daughton, "*Magnetic Tunneling Applied to Memory (Invited)*," Journal of Applied Physics, vol. 81, No. 8, Apr. 15, 1997, pp. 3758-3763.

W. Zhao et al., "*Evaluation of a Non-Volatile FPGA Based on MRAM Technology*," IEEE, 2006, pp. 1-4.

J.C. Slonczewski, "*Current-Driven Excitation of Magnetic Multilayers*," Journal of Magnetism and Magnetic Materials, vol. 159, 1996, L1-L7.

L. Berger, "*Emission of Spin Waves by a Magnetic Multilayer Traversed by a Current*," Physical Review B, vol. 54, No. 13, Oct. 1, 1996, pp. 9353-9358.

J.A. Katine et al., "*Current-Driven Magnetization Reversal and Spin-Wave Excitations in Co/Cu/Co Pillars*," Physical Review Letters, vol. 84, No. 14, 3 Apr. 2000, pp. 3149-3152.

J.Z. Sun, "*Spin-Current Interaction with a Monodomain Magnetic Body: A Model Study*," Physical Review B, vol. 62, No. 1, Jul. 1, 2000, pp. 570-578.

F.J.A. den Broeder, et al.,"*Magnetic Anisotropy of Multilayers*," Journal of Magnetism and Magnetic Materials, vol. 93, Feb. 1991, pp. 562-570 (abstract only).

G. Srinivas et al., "*Magnetic and Magneto-Optical Properties, of (Pt/Co/Pt/Ni) Multilayers*," Thin Solid Films, vol. 301, 1997, pp. 211-216.

R. Allenspach et al., "*Magnetization Direction Switching in Fe/Cu(100) Epitaxial Films: Temperature and Thickness Dependence*," Physical Review Letters, vol. 69, No. 23, Dec. 7, 1992, pp. 3385-3388.

G.H.O. Daalderop et al., "*Prediction and Confirmation of Perpendicular Magnetic Anisotropy in Co/Ni Multilayers*," Physical Review Letters, vol. 68, No. 5, Feb. 3, 1992, pp. 682-685.

D.P. Pappas et al., "*Reversible Transition Between Perpendicular and In-Plane Magnetization in Ultrathin Films*," Physical Review Letters, vol. 64, No. 26, Jun. 25, 1990, pp. 3179-3182.

F.J.A. den Broeder et al., "*Co/Ni Multilayers with Perpendicular Magnetic Anisotropy: Kerr Effect and Thermoma gnetic Writing*," Applied Physics Letters, vol. 61, No. 12, Sep. 21, 1992, pp. 1468-1470.

J. Ariake et al., "*Magnetic and Structural Properties and Co-Pt Perpendicular Recording Media with Large Magnetic Anisotropy*," Journal of Magnetism and Magnetic Materials, vol. 287, Feb. 2005, pp. 229-233.

Naoki Nishimura et al., "*Magnetic Tunnel Junction Device with Perpendicular Magnetization Films for High-Density Magnetic Random Access Memory*," Journal of Applied Physics, vol. 91, No. 8, Apr. 15, 2002, pp. 5246-5249.

J. Sort et al., "*Pinned Synthetic Ferrimagnets with Perpendicular Anisotropy and Tuneable Exchange Bias*," Applied Physics Letters, vol. 83, No. 9, Sep. 1, 2003, pp. 1800-1802.

D. Houssameddine et al., "*Spin-Torque Oscillator Using a Perpendicular Polarizer and a Planar Free Layer*," Nature Materials, vol. 6, Jun. 2007, pp. 447-453.

K.J. Lee, et al., "*Analytical Investigation of Spin-Transfer Dynamics Using a Perpendicular-to-Plan Polarizer*," Applied Physics Letters, vol. 86, Issue 2, Jan. 2005, pp. 022505-1 to 022505-3.

A.D. Kent et al., "*Spin-Transfer-Induced Precessional Magnetization Reversal*," Applied Physics Letters, vol. 84, No. 19, May 10, 2004, pp. 3897-3899.

S. Mangin et al., "*Current-Induced Magnetization Reversal in Nanopillars with Perpendicular Anisotropy*," Nature Materials, vol. 5, Mar. 2006, pp. 210-215.

\* cited by examiner

"0"

"1"

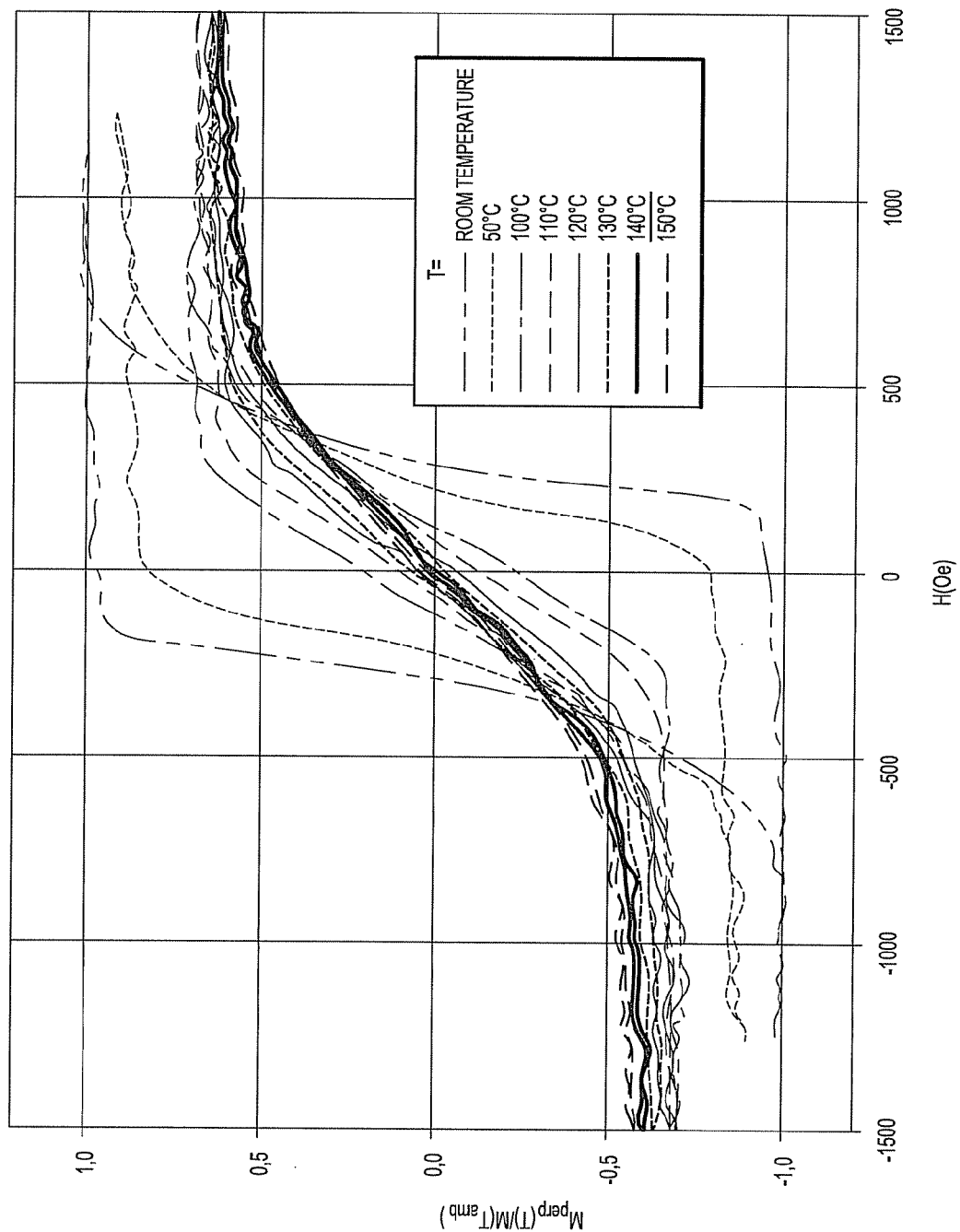

HEAT ASSISTED MAGNETIC WRITE ELEMENT

FIELD OF THE INVENTION

The present invention relates to the field of magnetic elements incorporating a magnetoresistive stack comprising two magnetic layers separated by an insulating tunnel barrier, a confined-current-path layer, a semiconducting layer or a metal layer, and in particular, a magnetic tunnel junction, such as those used in nonvolatile magnetic random access memories, which permit, in a manner known per se, the storage, reading and writing of data in electronic systems. More specifically, it applies to magnetic random access memories, designated conventionally by the acronym MRAM, consisting of a set of memory points each formed by a magnetic tunnel junction, also designated by the acronym MTJ. In a similar manner, the present invention also relates to logic elements having magnetic layers, insofar as they use at least one magnetoresistive stack comprising two magnetic layers separated by an insulating tunnel barrier, a confined-current-path layer, a semiconducting layer or a metal layer.

In the following description, the expression "magnetic element" therefore means a stack of magnetic layers comprising at least one pinned layer also known as a reference layer, a free layer also known as a storage layer, and between said layers an insulating or semiconducting layer or a confined-current-path layer. The definition of the concept of pinned layer and free layer will appear more clearly in the rest of the present description.

BACKGROUND OF THE INVENTION

Interest has revived in MRAM magnetic memories with the development of magnetic tunnel junctions (MTJ) having a resistance compatible with the use of CMOS components and a high magnetoresistance at ambient temperature.

Such magnetic memories with magnetic tunnel junctions have been described for example in document U.S. Pat. No. 5,640,343. In their simplest forms, they comprise two magnetic layers having different coercivities, separated by a thin insulating layer. When the magnetizations of the respective storage and reference layers, constituting the two abovementioned magnetic layers located on either side of the tunnel barrier, are antiparallel, the resistance of the magnetic tunnel junction is high. Conversely, when the magnetizations are parallel, this resistance becomes low.

Preferably, these two magnetic layers are made from 3d metals (Fe, Co, Ni) and alloys thereof (possibly containing boron and zirconium so as to make the structure of said layers amorphous and to flatten their interfaces) and the insulating layers are conventionally made from amorphous alumina ($AlO_x$) or crystalline magnesium oxide (MgO). Advantageously, the reference layer also called "pinned layer", may itself consist of a stack of several layers, such as described for example in document U.S. Pat. No. 5,583,725, so as to constitute a layer known as a "synthetic antiferromagnetic (SAF)" layer. Similarly, for each of the memory points, it is possible to replace the single magnetic tunnel junction by a double magnetic tunnel junction, such as described for example in the publication Y. SAITO & al, *Journal of Magnetism and Magnetic Materials>>*, Volume 223, 2001, page 293. In this case, the storage layer is inserted between two insulating layers, the structure comprising two reference layers positioned on the sides opposite said respective insulating layers.

The most conventional architecture, known as Field Induced Magnetic Switching (FIMS), that is the reversal of the magnetization by an induced magnetic field, is that described in document U.S. Pat. No. 6,021,065 and in the publication "*Journal of Applied Physics*" vol. 81, 1997, page 3758 and shown in FIG. 1.

As may be observed in FIG. 1 illustrating the prior art, each memory element or memory point 10 consists of the combination of a CMOS technology transistor 12 and a magnetic tunnel junction MTJ 11. Said tunnel junction 11 comprises at least one magnetic layer 20, called "storage layer" or "free layer", a thin insulating layer 21, and a magnetic layer 22 called "pinned layer", also known as reference layer. The functioning of these magnetic memories with memory points, each consisting of a magnetic tunnel junction, consists, for writing, in generating a pulsed magnetic field created by the current lines or conductors associated with each of said magnetic points.

Thus, and in the context of the FIMS architecture, three levels of current lines are observed. In FIG. 1, the two levels of line 14 (word line) and 15 (bit line), generally positioned at 90° from one another, are designed to generate magnetic field pulses for switching the magnetization of the free layer 20 during the write process. These magnetic field pulses are produced by circulating in the current lines 14 and 15, short electric pulses, typically for 2 to 5 nanoseconds, and having a current of about several milliamperes. The strength of these pulses and their synchronization are adjusted, so that only the magnetization of the memory point located at the intersection of these two current lines is subject to switching.

An additional current line 16 level, also called "control line" is designed to control the opening and closing of the transistor selection or switching channel 12 associated with each memory point, in order to address each memory element individually. In other words, the CMOS transistors 12 are used as switches.

In write mode of the addressed memory point, the transistor 12 selected is in blocked or "OFF" mode, so that no current passes through the transistor. A current pulse I is sent into the two current lines 14 and 15 corresponding to the memory point 10 selected. The pulse amplitude of current I is such that the magnetic field created is insufficient to switch the memory points on the lines 14 or 15, except at the intersection of the lines 14 and 15 where the joint contribution of the two lines is sufficient to generate a magnetic field that is also sufficient, and capable of switching the magnetization of the layer 20 of the addressed memory point.

In read mode, the transistor 12 is in saturated or "ON" mode by applying a voltage onto the grid of said transistor through the control line 16. A testing current is then sent into the current line 14 which can only cross the memory point of which the transistor 12 is placed in saturated or "ON" mode. This current is used to measure the resistance of the magnetic tunnel junction 11 of said selected memory point 10. From the value of this resistance, the corresponding status of the memory point 10 is determined as "0" (for a low resistance parallel magnetization configuration) or "1" (for a high resistance antiparallel magnetization configuration).

It will have been understood from the above that the strength of the pulses passing through the current lines 14 and 15 and their synchronization are adjusted so that only the magnetization of the memory point located at the intersection of these two current lines (selected point) can switch under the effect of the magnetic field generated by the two conductors. The other memory points located on the same line or on the same column (half-selected points) are accordingly subjected only to the magnetic field of one of the conductors 14, 15, and are consequently not switched.

Due to the write mechanism of these memory points, it is possible to understand the limits of this architecture.

Insofar as the writing is provided by an external magnetic field, it is subject to the value of the individual switching field of each memory point. Since the switching field distribution function for all the memory points is wide (in fact, this distribution is wide due to the manufacturing imperfections, particularly associated with the etching of the memory points and the intrinsic statistical fluctuations associated with the thermally activated magnetization fluctuations), it is necessary for the magnetic field on the selected memory point to be higher than the highest switching field of the distribution, at the risk of accidentally switching certain memory points located on the line or on the corresponding column, where the switching field located in the lower part of the distribution is lower than the magnetic field generated by the line or column alone. Furthermore, the power consumption of the memory making use of such an external magnetic field is commensurately higher with a wider switching field distribution.

Moreover, whereas in general, the mean value of the switching field increases as the size of the memory points decreases, which is a desirable arrangement for reasons of space, a commensurately higher current is anticipated in the future product generations. In consequence, the electric power required for the functioning of these memories will be commensurately higher as the integration density increases.

Another drawback of these prior art memories concerns the stability of the magnetization of the free layer with regard to thermal fluctuations as the size of the memory point decreases. Indeed, the energy barrier to be crossed to switch the magnetization of this layer from one orientation to the other is proportional to the volume of said layer. As the volume decreases, the height of the barrier becomes comparable to the thermal agitation. The data written in the memory is then no longer preserved. To overcome this difficulty, it is necessary to increase the magnetic anisotropy of the free layer by selecting a material having a higher anisotropy or by accentuating the shape anisotropy of the memory point, for example. In doing so, however, the magnetic field required for magnetic switching increases, due to a higher power consumption to generate the field necessary for the magnetic switching. The electric current in the "word line" and in the "bit line" may even, in certain cases, exceed the limit threshold imposed by the electromigration in the conducting lines (typically about $10^7$ A/cm$^2$).

SUMMARY OF THE INVENTION

Thus, in order to overcome this difficulty, it has been proposed to use magnetic random access memories having thermally assisted writing known by the acronym TAS-MRAM, in which the free layer or reference layer is itself pinned by an antiferromagnetic layer. This improvement is described for example in document U.S. Pat. No. 6,385,082.

In this configuration, instead of obtaining the write selectivity of the memory point by combining two perpendicular magnetic field pulses, this write selectivity is obtained by combining a short temperature rise of the memory point to be addressed, carried out by a current pulse passing through said addressed memory point, with either a magnetic field pulse, or by spin transfer obtained by a spin polarized current through the storage layer of said memory point.

FIG. 2 shows such a configuration. In this figure, the free layer 40 of the magnetic tunnel junction 31 is pinned by an antiferromagnetic layer 41. Similarly to the case of FIMS memories, an insulating layer 42 is inserted between the magnetic free layer 40 and a magnetic layer 43 called "pinned layer". In an advantageous version, the pinned magnetic layer 43 is coupled to an antiferromagnetic layer 44, whose function is to pin the layer 43 so that its magnetization is not switched during writing.

Here also, the pinned ferromagnetic layer 43 may be a synthetic antiferromagnetic layer consisting of several layers, more precisely of two coupled magnetization ferromagnetic layers aligned antiparallel across a separating layer, for example of ruthenium, having a thickness of 0.6 nm to 0.9 nm.

According to this configuration, the antiferromagnetic layer 41 has a limit "blocking" temperature $T_B$ above which the stabilizing "exchange" magnetic field that it exerts on the free layer 40 is no longer effective on said free layer 40. The material constituting the antiferromagnetic layer 41 and its thickness are selected so that the blocking temperature $T_B$ is higher than the standby temperature of the memory (operating temperature at rest). Similarly, the blocking temperature $T_B$ of the antiferromagnetic layer 44 adjacent to the pinned layer 43 is selected so as to be higher and fairly distant from the blocking temperature of the antiferromagnetic layer 41.

Thus, at a temperature lower than the blocking temperature of the antiferromagnetic layer 41, the free layer 40 is stabilized by the exchange magnetic field, and thereby proves to be very difficult to switch by the mere application of an external magnetic field or by spin transfer carried out by a spin bias current through the free layer. At the blocking temperature of the antiferromagnetic layer 41 and above, since the exchange field is nil, the free layer 40 thereby becomes very easy to switch using an external magnetic field, provided that said field is higher than the coercive field of the free layer 40 at the given temperature, or by spin transfer with a spin polarized current density crossing the free layer that is sufficiently high to cause the magnetic switching. Accordingly, a material enabling said free layer 40 to have a low coercive field is selected if the switching is obtained by a magnetic field, or a low critical switching current density if the switching is obtained by spin transfer.

This particular architecture comprises two or three current line levels according to whether the switching is obtained by spin transfer or by magnetic field. For magnetic field writing, a current line 30 called "field line" is located under the magnetic tunnel junction 31, but without being in contact therewith. It is intended to generate the magnetic field required to switch the magnetization of the free storage layer 40, insofar as it is crossed by an electric current of several milliamperes. This line does not exist if the switching is obtained by spin transfer. Another current line 32 called "bit line" is located above the magnetic current junction 31 of the memory point concerned and in contact therewith. A third current line 33 called "word line" is in contact with the grid of a CMOS transistor 35. Similarly as for the FIMS, the line 33 controls the opening or closing of the transistor channel by the application or not of a threshold voltage, each of the transistors functioning in switch mode for each of the associated memory points. The channel of the transistor 35 is itself connected in series with the junction 31 by one or more vias 34.

In read mode, the CMOS transistor 35, associated with the memory point to read, is opened by the application of an adequate voltage in the "word line" 33. A testing current is then sent via "bit line" 32, a current that can only cross the memory point of which the transistor 35 is open. By this current, a measurement is taken of the resistance of the magnetic tunnel junction 31 of the selected memory point. From the resistance value, the corresponding status of the memory point is determined as "1" or "0", the state "1" corresponding for example to the maximum resistance and the state "0" to the minimum.

In write mode, the CMOS transistor 35 of the memory point to write is opened by the application of an adequate voltage in the "word line" 33. A heating current stronger than the testing current is then sent into the memory point to write by the "bit line" 32. Above a certain current density, the current causes a rise in the temperature of the magnetic tunnel junction 31 above the blocking temperature of the antiferromagnetic layer 41. The exchange field stabilizing the free layer 40 then becomes virtually nil, and the magnetization of said free layer is accordingly very mobile. For a magnetic field switching, an electric current of several milliamperes is then sent into the field line 30 once the blocking temperature is reached (after a few nanoseconds). This pulse generates a sufficient magnetic write field to switch the magnetization of the free layer 40 to the desired direction (writing of bit "1" or "0"), said layer being, as previously described, very mobile with a low intrinsic coercivity. While the current continues to flow in the line 30, the heating current is cut off in the magnetic tunnel junction 31 (by interrupting the current in the "bit line" 32 and opening the transistor 35). The overall temperature of the memory point then drops very rapidly (a few nanoseconds) below the blocking temperature of the antiferromagnetic layer 41 (typically at the service temperature at rest), the magnetization of the free layer 40 being maintained during the cooling, by the magnetic field generated by the current flowing in the line 30. This enables the pinning of the magnetization of the layer 40 by the antiferromagnetic layer 41 to resume during the cooling in the direction defined by the write field. When the temperature of the layers 40 and 41 falls below the blocking temperature, the current flowing in the line 30 is switched off and the magnetic write field becomes nil.

For a switching by spin transfer, the heating current is used both to heat the storage layer of the tunnel junction and to apply a spin transfer torque to the magnetization of this layer. To switch the magnetization of the storage layer to the parallel state, the flow of electrons from the heating current must go from the reference layer to the storage layer, which means that the heating current must go from the storage layer to the reference layer. On the contrary, to switch the magnetization of the storage layer to the antiparallel state, the flow of electrons of the heating current must go from the storage layer to the reference layer, which means that the heating current must go from the reference layer to the storage layer.

Such heat assisted magnetic write memories have a number of advantages, among which the following may be mentioned:
 significant improvement in the write selectivity because only the memory point to write is heated;
 retention of the data written in the memory even if the memory point is exposed to undesirable magnetic fields at ambient temperature;
 improvement of the heat stability of the data by using materials with a high magnetic anisotropy (intrinsic, and due to the shape of the memory point or to the exchange anisotropy field of the storage layer), at ambient temperature, thereby allowing to significantly reduce the size of the cells of the memory points without affecting their stability limit;
 reduction of consumption during writing;
 possibility of obtaining multilevel storage cells in certain circumstances.

It has also been shown that the same technology could be used to fabricate logic elements such as reprogrammable logic gates (see for example the publication "Evaluation of a non-volatile FPGA based on MRAM technology" by Zhao-W; Belhaire-E; Javerliac-V; Chappert-C; Dieny-B, Proceedings.-2006-International-Conference-on-Integrated-Circuit-Design-and-Technology. 2006: 4 pp, IEEE, Piscataway, N.J., USA). These logic elements also combine semiconductor components in CMOS technology with magnetic tunnel junctions as described above. Unlike the memories designed to store data, these logic elements serve to process these data and to perform logic operations on these data. The magnetic tunnel junctions are often used in these elements as variable resistors which serve to change the switching thresholds of the CMOS circuits.

The heat assisted write approaches described nevertheless have defects. When the magnetic switching is obtained by magnetic field, although lower than in the conventional approach, the magnetic write field, in order to be generated, requires the sending of a current pulse, typically of 2 to 4 mA, into the conducting line located above the memory point. The use of memory elements having a cross section close to a circle allows to minimize the magnetic write field by minimizing the shape anisotropy of the element. However, any difference from a perfectly circular cross section, for example associated with etching defects, is liable to cause a shape anisotropy of a few mT again yielding the need to increase the write field. Once again, when the cross section of the conducting lines is reduced to increase the density of the memories or logic circuits, the problem arises of the electromigration limit in the conducting line.

Furthermore, when the magnetic switching takes place by spin transfer, the current densities required are high, typically in the range of a few $10^6$ A/cm$^2$, thereby subjecting the tunnel barrier to a high electrical stress. An attempt is therefore made to reduce this critical write current density by spin transfer.

The object of the present invention equally concerns MRAMs with heat assisted writing and logic elements in which the magnetic configurations of the tunnel junctions are modified by writing by heat assisted field or by heat assisted spin transfer.

The first object of the present invention is to propose the use of materials for the storage and reference layer of the tunnel junction, which have an out-of-plane magnetization. The reorientation of the magnetization of the storage layer from out-of-plane to in-plane is spontaneously induced under the effect of the rise in temperature caused by the flow of a heating current through the junction.

If the case where the write process combines heating and application of a pulse of magnetic field, then a weak magnetic field is accordingly applied "upward" or "downward", at least during the initial phase of cooling of the storage layer, in order to slightly draw the magnetization of this layer to the upper hemisphere or to the lower hemisphere during the initial phase of the reorientation of the magnetization from planar to out-of-plane. The weak field applied serves to select the hemisphere "upward" or "downward", but subsequently, the anisotropy reorientation serves to complete the reorientation of the magnetization of the storage layer along the normal to the plane, "upward" or "downward".

The approach proposed thereby allows maximizing the magnetic torque applied by the magnetic field to the magnetization of the storage layer during its application, because when the magnetization of the storage layer is in the plane, the field is applied at 90° from the magnetization direction (therefore maximum torque allowing a reduction of the amplitude of the field to be applied). Furthermore, this configuration allows minimizing the switching field distributions associated with the fluctuations in shape of the various memory elements which may be encountered with planar-magnetization materials.

Reading is carried out at a lower current density than writing, so that the temperature rise is insufficient to cause the switching of the magnetization of the storage layer.

Furthermore, to overcome the problem of having to apply a magnetic field during writing, it has been proposed to combine the heating of the magnetic tunnel junction with the action exerted by the spin polarized current which enters the storage layer of the tunnel junction (see for example FR 2 832 542). In fact, it had been predicted theoretically by J C. Slonczewski and L. Berger (Journ. magn. Magn. Mater. 159, Li (1996) and Phys. Rev. B. 54, 9353 (1996)) and observed experimentally a few years later by J. Katine et al (Phys. Rev. Lett. 84, 3149 (2000)) that when a spin polarized current is injected into a magnetic nanostructure, this current applies a torque to the magnetization of the nanostructure, called spin transfer torque or spin torque, which may help to adjust the magnetization of the nanostructure and in particular to reorient it in a desired direction. This spin transfer phenomenon can therefore be used as a novel means for writing data in MRAM devices or logic components. J C. Slonczewski demonstrated that this spin transfer torque has the form of a new term in the Landau Lifshitz Gilbert equation which governs the magnetization dynamic in magnetic systems. This new term is written $\Gamma = a_J M\char`^(M\char`^P)$ where the prefactor $a_J$ is proportional to the current density passing through the nanostructure and to the bias of this current, M is the vector representing the magnetization of the nanostructure traversed by the spin polarized current, P is the current bias direction. The particularly advantageous factor of spin transfer as a means of writing data is that since the prefactor of the spin transfer term is proportional to the current density passing through the nanostructure, it is therefore the current density that determines the switching threshold of the magnetization of the magnetic nanostructure and not the total current as in the magnetic field write approaches. For example, for a plane magnetic nanostructure having a thickness D, having a sufficiently small dimension (typically lower than 100 nm) to be treated as a macrospin approximation, it has been demonstrated that the magnetization of the nanostructure may switch under the influence of a spin polarized current passing through this nanostructure perpendicular to its plane, when the prefactor of the spin transfer term reaches the value $(a_J)_{crit} = \pm \alpha(2\pi M_s + H_K) + \alpha H_{ext} \approx \alpha 2\pi M_s$ where $\alpha$ is the Gilbert damping constant, Ms is the spontaneous magnetization of the nanostructure, $H_K$ is the anisotropy field. This critical value of the prefactor $a_J$ determines the critical value of the density of this current causing the magnetic switching, knowing that the two quantities are related by:

$$(a_J) = -\frac{|g|}{2} \frac{\mu_B}{M_s^2} \frac{1}{d} \frac{J}{e} P$$

where g~2 is the Landé factor, $\mu_B$ the Bohr magneton, e the electron change, P the current bias, and J the current density (Sun, Phys. Rev. B 62, 570 (2000)).

Accordingly, when the lateral dimension of the memory element or logic component is reduced, the current required also decreases as a function of the cross section of the element (current=current density*section). Thus this write approach by spin transfer offers far better prospects for developments in the characteristics of memory or logic devices using these elements than for a writing involving magnetic field pulses generated by electric current pulses in conducting lines.

However, to simply use the spin transfer effect during writing raises the problem of the thermal stability of the magnetic element in very small dimensions. In fact, for a nanostructure having a volume V and a uniaxial anisotropy per unit volume K (associated with the shape of the nanoparticle and/or to a magnetocrystalline or stress induced anisotropy), the energy barrier separating the two stable magnetization states of the system is KV. It is well known to a person skilled in the art that if the temperature fluctuations given by $K_B T$ represent a significant fraction of KV, then the magnetization of the nanostructure becomes unstable with regard to the temperature fluctuations, so that the nanostructure can no longer store the data inscribed in the orientation of its magnetization. This is well known by the term of "superparamagnetic limit". Increasing the shape factor of the nanostructure excessively (for example by giving it an elliptical shape with a major axis/minor axis shape ratio above 2) does not help to solve the problem, because the magnetization is then switched by wall propagation nucleation and no longer by coherent switching. The height of the barrier then only barely increases with the shape factor of the particle.

To circumvent this problem, it is advantageous to combine the writing by spin transfer with heat assisted writing. Thanks to the same current passing through the structure, it is possible both to heat the nanostructure and to apply the torque to the magnetization which causes the switching thereof. The temperature rise serves, just at the time of writing, to lower the barrier necessary for the magnetization switching, while preserving a high nonwrite barrier height and therefore good temperature stability.

Thus a second object of the present invention is to propose an optimal way to implement this combination of heat assisted writing with spin transfer switching. It is also based on the use of out-of-plane magnetization materials, of which the anisotropy switches from out-of-plane to planar under the effect of the heating at the time of writing. However, the spin polarized current generating the spin transfer torque applied to the magnetization of the nanostructure is and remains out-of-plane of the nanostructure at all the operating temperatures of the device. Thus the spin polarization is perpendicular to the magnetization direction of the storage layer at the most crucial moment of the write process (that is around the maximum temperature reached by the magnetic element during writing) which serves to maximize the spin transfer efficiency and thereby minimize the current density required for writing. In fact, the latter varies approximately with the sine of the angle between the direction of current polarization and the magnetization of the nanostructure, in particular in the case of magnetic tunnel junctions.

Reading is carried out a lower current density than writing, so that the temperature rise and/or spin transfer applied to the nanostructure are insufficient to cause the switching of its magnetization.

GENERAL PRINCIPLE OF THE INVENTION

Thus, the invention relates to a magnetic element for writing by magnetic field or by heat assisted spin transfer comprising:
  a free magnetic layer, also called storage layer or switchable magnetization layer, of which the magnetization direction is switchable between two nonwrite stable states, both directed out-of-plane of said layer and in particular substantially perpendicular to the plane of said layer;

a reference magnetic layer, called pinned layer, of which the magnetization is oriented substantially perpendicular to the plane of said layer;

a nonmagnetic spacer inserted between the two layers;

means for making an electric current flow substantially perpendicular to the plane of said layers.

According to the invention, the switching of the free layer magnetization causes a spontaneous reorientation of the magnetization from out-of-plane and in particular substantially perpendicular to the plane to substantially in the plane, induced by a temperature rise produced by an electric current passing through the magnetic element via said means. The switching of the magnetization of said layer into one or the other of the two stable states results from the application of a magnetic field directed outside the plane of the layer, or by using the spin transfer effect induced by the flow of a spin bias current in the magnetic layer in the substantially out-of-plane direction.

In other words, the memory or logic element comprises a magnetic layer called reorientable magnetization storage layer having two stable nonwrite magnetization states (on standby). The binary data is coded by the orientation of the magnetization along one or the other of these states. This layer is inserted in a stack of layers comprising means for circulating an electric current substantially perpendicular to the plane of the magnetic layer. The stack is such that the two stable magnetic states are characterized by two different values of the electrical resistance of the structure. The stack may be a magnetic tunnel junction, or a metal structure or having confined-current-paths, giant magnetoresistance, or a structure called a spin filter comprising a magnetic oxide barrier.

In nonwrite mode (on standby), the magnetization of the magnetic layer is substantially oriented out-of-plane and in particular perpendicular to the plane of the layer under the effect of a perpendicular anisotropy which may have an interfacial or volume origin. Perpendicular anisotropy phenomena in magnetic thin films have been described for example in the article by Den Broeder et al, Journ. Magn. Magn. Mater. 93, 562 (1991).

In general, thin magnetic layers tend to have their magnetization in the plane of the layers because of the shape anisotropy of the thin layers. This enables them to minimize their magnetostatic energy. This shape anisotropy gives rise to an energy term per unit volume of the magnetic layer of the form (in CGS) $K_{shape} = 2\pi M_s^2 (\hat{n}.\hat{M})^2$ where $\hat{n}$ is a unit vector normal to the plane of the layer, $\hat{M}$ is a unit vector parallel to the magnetization of the layer of which Ms is the spontaneous magnetization. However, certain thin layers or magnetic multilayers have a magnetization orientation perpendicular to the plane of the layer. This is due to the presence of an out-of-plane anisotropy that is greater than the shape anisotropy. This additional anisotropy may be of volumetric or interfacial origin.

It may be of magnetocrystalline origin, as for example in cobalt having a hexagonal structure. The c axis of the hexagonal lattice of cobalt constitutes an easy axis of orientation of the magnetization of cobalt. If this c axis of the hexagonal lattice corresponds to the growth direction (that is perpendicular to the plane of the layer), then the magnetization of the cobalt layer may be oriented along the normal to the plane of the layer.

The perpendicular anisotropy may also be associated with stresses generated during the growth of the layers. These stresses, combined with the magnetoelastic effects in the magnetic layer, can generate a perpendicular anisotropy.

The perpendicular anisotropy may also be caused by interfacial electronic structure effects, in particular effects of orbital atomic hybridization combined with spin-orbit coupling. Among the well known materials having an out-of-plane anisotropy, mention can be made of the multilayers (Pt/Co), (Pd/Co), (Au/Co) (Den Broeder et al, Journ. Magn. Magn. Mater. 93, 562 (1991)), (Pt/Co/Pt/Ni) (G. Srinivas et al, Thin Solid Films 301, 211 (1997)), Fe/Cu(100) (R. Allenspach, Phys. Rev. Lett, 69, 3385 (1992)), (Co/Ni) (Daalderop et al, Phys. Rev. Lett. 68, 682 (1992)) and also rare earth/transition metal alloys such as GdCo, TbCo, TbFe, etc.

These additional anisotropy terms may be expressed in the form of a perpendicular anisotropy per unit volume of the magnetic layer $$K_{perp} = -\left(K_{vol} + \frac{K_{surf}}{d}\right)(\hat{n}.\hat{M})^2$$

where $K_{vol}$ includes all the volumetric contributions to this anisotropy, and $$\frac{K_{surf}}{d}$$

the surface or interfacial contributions, where d is the thickness of the magnetic layer. Higher order terms in $(\hat{n}.\hat{M})^2$ may exist (order 4, 6, etc.) but are not considered for the sake of simplification; this is well known to a person skilled in the art and does not change the substance of the discussion and of the invention.

In fact, it has been demonstrated by various authors that when the temperature of the magnetic layer increases, its magnetic anisotropy decreases relatively rapidly, typically as the cube of the magnetization:

$$\frac{K_{perp}(T)}{K_{perp}(0)} = \left[\frac{M_s(T)}{M_s(0)}\right]^3.$$

For higher order anisotropy terms, the decrease is much faster (typically to the power of 10 for the 4$^{th}$ order term). All this is described for example in the article by R. J. Jensen et al, Phys. Rev. B. 42, 849 (1990).

Thus, the shape anisotropy decreases slower with temperature (power 2 of Ms) than the perpendicular anisotropy (power 3 of Ms or more). Accordingly, when the temperature rises above a certain critical temperature, the shape anisotropy (planar) becomes predominant over the perpendicular anisotropy, so that the magnetization of the layer switches from out-of-plane below this critical temperature to in-plane above this critical temperature.

This anisotropy reorientation is also favored for entropic reasons: there are many more available states of magnetization orientation in the plane than out-of-plane. These anisotropy reorientations are discussed in the article by R. J. Jensen et al, Phys. Rev. B. 42, 849 (1990).

From the experimental standpoint, these anisotropy reorientations from perpendicular to planar as a function of temperature have been observed by various groups (for example R. Allenspach et al, Phys. Rev. Lett. 69, 3385 (1992); D. P. Pappas et al, Phys. Rev. Lett. 64, 3179 (1990)).

The variation in magnetization under perpendicular field is reversible throughout the field range applied out-of-plane.

The invention consists in taking advantage of this anisotropy switching induced by the temperature by combining the anisotropy switching with 1) either the application of an out-of-plane magnetic field (first embodiment), 2) or by using the spin transfer effect induced by the flow of a spin bias current in the magnetic layer in the out-of-plane direction.

Regardless of the write mode, the stack in which the magnetic storage layer is inserted is such that the flow of the electric current through the stack causes a temperature rise of said magnetic layer of typically 100 to 200° C. during the writing, as in the thermally assisted write memories (Cf. for example FR2 832 542).

The stack according to the invention is such that this temperature rise, during writing, is sufficient to switch the magnetization of the magnetic storage layer from substantially out-of-plane having a low current density (on standby (zero current) or in reading (read current lower than the write current by a factor of about 2 to 4)) to in-plane at the current density used for writing. The heating is obtained for example by inserting the magnetic layer in a magnetic tunnel junction, the magnetic storage layer constituting one of the magnetic electrodes in direct contact with the tunnel barrier. The dissipation produced by the energy relaxation of the hot electrodes tunneling through the barrier thus leads to a heating of the junction and in particular of the magnetic layer adjacent to the barrier. The temperature rise produced by a given current density can be adjusted by adjusting the thicknesses of the layers, the composition of the stack and, in particular, the introduction of thermal barriers between the tunnel junction and the conducting electrodes which electrically connect the top and the base of the tunnel junction, as described for example in document WO2005036559. The current densities typically required to raise the temperature of the tunnel junctions having a resistance*area product between a few $\Omega \cdot \mu m^2$ and a few tens of $\Omega \cdot \mu m^2$ of about $\Delta T=100°$ C. to 220° C. in a few nanoseconds are typically about $5 \times 10^5$ A·cm$^2$ to $5 \times 10^6$ A·cm$^2$.

Furthermore, for these two embodiments, it is important to minimize the magnetostatic field radiated by the reference layer on the storage layer, because this radiated field also affects the hemisphere in which the magnetization of the storage layer is drawn during its cooling. To minimize this radiated field, two methods are available:

use of a synthetic antiferromagnetic pinned layer: the reference layer with out-of-plane magnetization is coupled antiparallel with a pinned layer having an out-of-plane magnetization, preferably itself pinned by an antiferromagnetic layer (for example made from IrMn or PtMn). The thicknesses of the pinned and reference layers can be adjusted according to the composition of the stack and of the cross section of the tunnel junction so that the field radiated by the combination of the reference layer and the pinned layer is zero on average over the volume of the storage layer.

it is also possible to add, on the other side of the storage layer with regard to the reference layer, another magnetization layer pinned in the opposite direction to the magnetization of the reference layer, so that the fields radiated by the reference layer and this additional pinned layer are mutually compensated in the storage layer. This additional layer must be separated from the storage layer by a thin nonmagnetic metal layer, for example made from copper, so that there is no direct coupling between the storage layer and this additional layer.

Thus, the storage layer according to the invention may:

be made from a magnetic alloy (FePt, FePd, CoPt, CoPd);
or consist of a multilayer or a combination of multilayers based on Co, Ni, Fe, Pt, Pd;
or consist of the combination of two layers in exchange interaction, one having a high out-of-plane anisotropy, the other which would have a planar magnetization if it were alone but which, by exchange interaction with the first, has its magnetization drawn out-of-plane at the standby (nonwrite) temperature.

Furthermore, the nonmagnetic spacer separating the storage layer from the reference layer consists of:

an amorphous tunnel barrier (alumina, HfOx, TaOx, TiOx) or crystalline tunnel barrier (MgO, SrTiO$_3$)

a confined-current-path insulating layer (AlCuOx, MgCuOx, HfCuOx, TaCuOx);

a semiconducting layer (Ge, GaAs)

or a metal layer (Cu, Au).

According to the first embodiment of the invention, the switching in one of the two stable states of the storage layer results, in addition to the heating of said layer, from the application of a magnetic field along a direction substantially normal to the plane of the layers, substantially in the "upward" or "downward" direction.

According to the second embodiment of the invention, the switching carried out in one of the two stable states of the storage layer results, in addition to the heating of said layer, from the injection of a spin bias current with a bias substantially oriented perpendicular to the plane of the storage layer in said storage layer.

Furthermore, the fact of using heat assistance serves to have a better thermal stability of the magnetization on standby (nonwrite) because the out-of-plane magnetic anisotropy can be selected to be very high at the standby temperature according to the principle of Heat Assisted Magnetic Recording (HAMR) well known to a person skilled in the art.

It is also interesting to observe that in this geometry, the Amperian field created by the current passing through the structure also has a beneficial effect on the magnetization reorientation from out-of-plane to planar induced by the temperature. Indeed, for a current flowing perpendicular to the plane of the layers, this Amperian field has a planar vortex symmetry. This field therefore also tends to pull the magnetization of the storage layer in-plane when the current density increases. The effect of the Amperian field is therefore added to that of the temperature. This implies that the principle of the present invention could be applied to larger diameter elements (for example 150 to 300 nm) than in the case of planar magnetization structures in which the Amperian field has a rather harmful effect on the magnetization switching.

The present invention is therefore based on the combined effect of magnetization reorientations caused by a variation in temperature and a discrimination between "upper hemisphere" and "lower hemisphere" induced either by the application of a magnetic field (first embodiment), or by spin transfer, using a bias current perpendicular to the plane of the layers (second embodiment).

BRIEF DESCRIPTION OF THE DRAWINGS

The manner in which the invention can be implemented and the advantages thereof will appear clearly from the following embodiments, provided for information and nonlimiting in conjunction with the appended figures.

FIG. 10 is a curve showing the variation in magnetization as a function of the magnetic field for a particular stack of the invention.

DETAILED DESCRIPTION OF THE INVENTION

Figure 1:
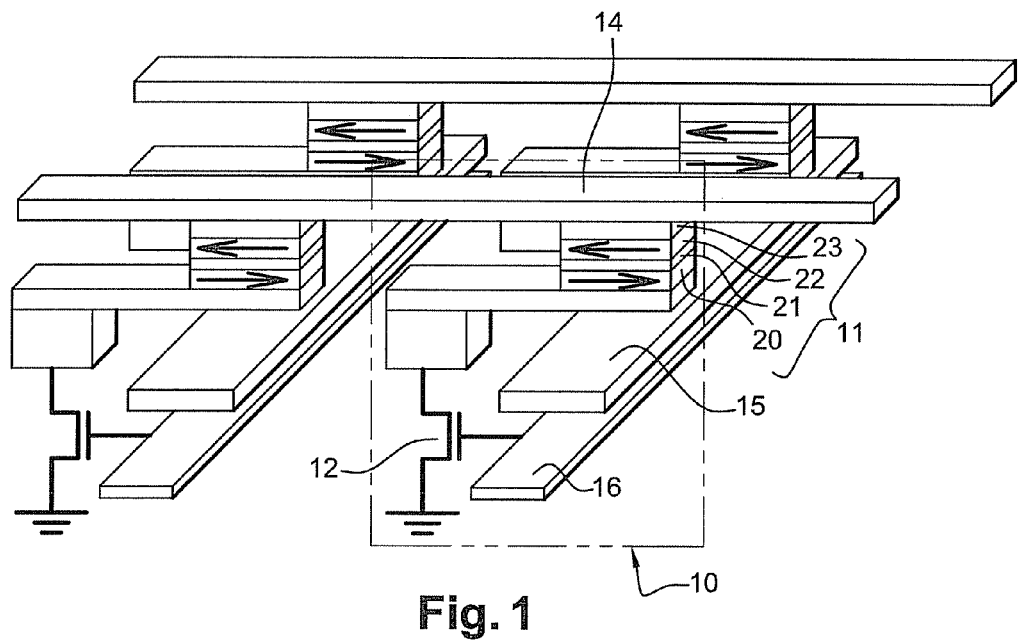
FIG. 1, as already indicated, is a schematic representation of the architecture of a magnetic memory of the FIMS type of the prior art.
Figure 2:
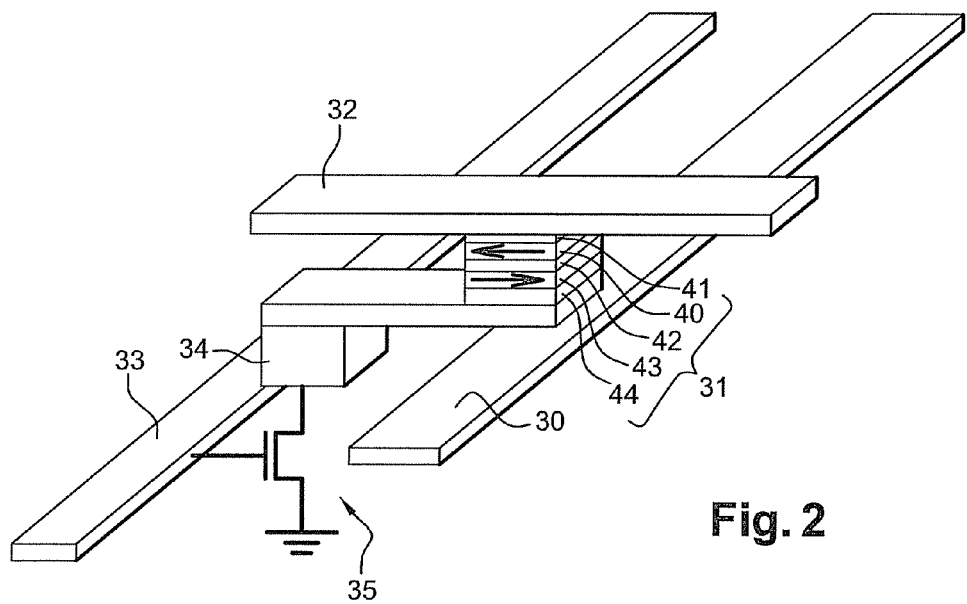
FIG. 2, also already described, is a schematic representation of a magnetic memory using a heat assisted MRAM write memory, also known in the prior art.
Figure 3:
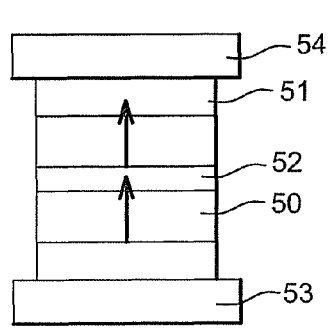
FIG. 3 is a schematic representation of a memory point or a logic element according to one embodiment of the invention.

The magnetic element at the core of the memory point or the logic element of the invention is a magnetoresistive element using the giant magnetoresistance or tunnel magnetoresistance effect. The core of this magnetoresistive element basically comprises a sandwich formed of two magnetic layers 50, 51 separated by a non magnetic spacer 52.

According to the invention, the two magnetic layers have a nonwrite anisotropy perpendicular to the plane of the layers.

The fixed magnetization layer or reference layer 50 has magnetic properties such that its magnetization remains perpendicular to the plane throughout the temperature range in which the magnetic element operates (in particular during writing and especially during reading and on standby). This operating temperature range may extend from as low as desired to typically +250° C. at the time of writing. There is no lower temperature limit for the operation of a fixed magnetization layer because the out-of-plane anisotropy rather tends to be reinforced as the temperature is lowered.

This reference layer 50 can be fabricated in various ways:
It may thus consist of a multilayer:
- formed of alternating ultrathin layers of Co and Ni, for example having a period (Co 0.2 nm/Ni 0.4 nm) (see F. den Broeder et al, Appl. Phys. Lett. 61, 1468 (1992)). In these multilayers, the anisotropy switching temperature may be above 400° C.;
- comprising bilayers of magnetic transition metal/oxide such as CoFe/Alumina. Such multilayers also demonstrate high out-of-plane anisotropies and can withstand temperatures up to 250° C. Such multilayers have been described for example in yet unpublished French patent application FR 06.55943;
- having a period (Pt/Co) or (Pd/Co). In the latter, it is known that the anisotropy order and correlatively switching temperatures are strongly dependent on the thickness of the individual layers. The Pt and Co thickness can therefore be adjusted to obtain an anisotropy switching temperature above 250° C. Similarly, multilayers having a period (Pt/Co/Pt/Ni) may have anisotropy switching temperatures above 250° C. For example, the article by G. Srivinas et al, thin Solid Films 301 (1997) 211, describes multilayers having a period (Pt/Co/Pt/Ni). For certain thicknesses, Curie temperatures above 280° C. are observed for example for (Pt 0.69 nm/Co 0.5 nm/Rt 0.69 nm/Ni 0.3 nm) ($T_{Curie}$=280° C.) or (Pt 0.69 nm/Co 0.7 nm/Pt 0.69 nm/Ni 0.3 nm) ($T_{Curie}$=290° C.). However, these multilayers often display interdiffusion effects at the interfaces at temperatures of about 200° C. In consequence, it may be preferable to employ one of the solutions previously proposed.

It may also consist of a single-layer fabricated:
- on the basis of FePt or FePd ordered alloys, which have order temperatures of about 700K and which preserve an out-of-plane anisotropy up to 250° C.;
- on the basis of CoPt or CoPd alloys with Co concentrations between 85% atomic and 50% atomic, as described in the article J. Ariake et al, Journ. Magn. Magn. Mater. 287 (2005) 229;
- on the basis of CoCr alloys having a hexagonal structure with a c axis perpendicular to the plane of the layers like those having a composition close to $Co_{80}Cr_{20}$ used in the media for perpendicular magnetic recording;
- on the basis of certain rare earth/transition metal alloys such as TbFeCo which also display out-of-plane anisotropies which can withstand temperatures up to 250° C. An exemplary embodiment of tunnel junctions having out-of-plane magnetization based on such alloys is given in the article by N. Nishimura et al, Journ. Appl. Phys. 91, 5246 (2002).

Optionally, various improvements can be made to the composition of this fixed magnetization layer 50 oriented out-of-plane.

Thus, it may be advantageous to add, between this fixed magnetization layer 50 and the nonmagnetic spacer 52 separating this fixed magnetization layer from the storage layer 51, a thin layer of magnetic material whereof the magnetization is also out-of-plane by exchange coupling with the fixed magnetization layer 50. The purpose of this additional magnetic layer is to increase the amplitude of the magnetoresistance of the magnetic element and, correlatively for the second embodiment, to reinforce the bias of the current which draws the magnetization from the storage layer into the "upper hemisphere" or the "lower hemisphere" by spin transfer. For example, if the nonmagnetic spacer 52 is an MgO tunnel barrier, this thin additional magnetic layer can be made from a CoFeB or CoFe alloy having a composition sufficiently rich in Fe (typically above 30%) to have a cubic phase-centered structure compatible with the structure of the MgO barrier. The thickness of this layer must not be excessive (typically lower than 4 nm) so that its magnetization does not fall into the plane parallel to the interfaces due to an excessive contribution of the shape anisotropy. This is described in document FR 2 904 724.

It may also be advantageous to replace the fixed magnetization layer 50 by a layer called a synthetic antiferromagnetic layer (FIGS. 5 and 7), consisting of two fixed magnetization layers 60, 61 oriented out-of-plane and coupled antiparallel by a layer 62 suitable for inducing an antiferromagnetic coupling between adjacent ferromagnetic layers such as, for example, a thin layer of ruthenium having a thickness of 0.5 to 0.9 nm. It may also be possible, for example, to make a fixed magnetization layer having a composition (Co 0.25 nm/Ni 0.4 nm)$_6$/Ru 0.6 nm/(Co 0.25 nm/Ni 0.4 nm)$_4$. As known to a person skilled in the art, the advantage of replacing the single fixed magnetization layer by such a synthetic antiferromagnetic structure is to make the magnetization of the fixed magnetization layer even more pinned and therefore even more resistant to the magnetic disturbances. Moreover, this reduces the magnetostatic field radiated by said synthetic antiferromagnetic layer on the storage layer.

Similarly, in order to reinforce the pinning of the fixed magnetization layer, said simple fixed magnetization layer or synthetic antiferromagnetic layer can be coupled to an antiferromagnetic layer, for example made from PtMn having a typical thickness of 12 to 20 nm or IrMn having a typical thickness 6 to 10 nm. As well known to a person skilled in the art, the exchange interaction between the antiferromagnetic layer and the adjacent ferromagnetic layer has the effect of pinning the magnetization of the adjacent ferromagnetic layer. This technique is used in particular in spin valves or magnetic tunnel junctions, a technique that also functions with an anisotropy perpendicular to the plane of the layers as described in article "*Pinned synthetic ferrimagnets with perpendicular anisotropy and tuneable exchange bias*", J. Sort, B. Rodmacq, S. Auffret, and B. Dieny, Appl. Phys. Lett. 83, 1800 (2003).

The storage layer 51 is made from a material selected so that during writing, the heating produced by the current flowing through the spacer 52, and in this case a tunnel barrier, causes a reorientation of its magnetization from perpendicular to the plane of the layers to planar. This reorientation is associated with the rapid drop in the perpendicular anisotropy of this layer with the temperature, which thereby becomes lower than the shape anisotropy of the layer, which stands to orient the magnetization in the plane of the layer.

As for the fixed magnetization layer 50, this layer 51 may have a multilayer structure based on Co, Ni, Fe, Pt, Pd, Cr, but whereof the thicknesses and composition of the layers are selected to give rise to this anisotropic switching between the standby (nonwrite) temperature and the maximum temperature reached during writing (about 140 to 250° C.). This may be based in particular on:

multilayers $(Pt/Co_{1-x-y}Fe_xNi_y)$ or $(Pd/Co_{1-x-y}Fe_xNi_y)$ where the alloys $Co_{1-x-y}Fe_xNi_y$ are rich in Co (x+y<50%). In these multilayers, it is known that the decrease of the magnetization, and hence of the anisotropy, depends strongly on the thicknesses of the layers of Pt or Pd and of magnetic alloys. In general, the decrease as a function of temperature is faster as the proportion of magnetic alloy decreases with regard to the proportion of Pt;

multilayers (Co/Ni) but slightly richer in Ni than for the fixed magnetization layer;

multilayers (Pt/Co/Pt/Ni);

combination of stacks having the form (Co/Ni)/(Co/Pt);

multilayers based on transition metal alternating with thin oxide layers as described in yet unpublished patent application FR 06.55943;

a single layer of alloys having a perpendicular anisotropy at the standby temperature: CoCr or FePt or FePd or rare earth-transition metal alloys (for example TbFe, TbCo).

In general, the composition and the thickness of the ferromagnetic storage layer can be adjusted to adjust the temperature at which the anisotropy switching of this layer occurs. In fact, as previously explained, in these systems, the out-of-plane anisotropy is often induced by an interfacial anisotropy whose temperature dependence follows a power of 3 of the spontaneous magnetization of the materials constituting this layer. This anisotropy is counterbalanced by the shape anisotropy which varies as the power of 2 of the spontaneous magnetization. More quantitatively, it can be written that the total anisotropy of the layer per unit volume is given by (in CGS):

$$K(T) = -2\pi M_s^2(0)\left[\frac{M_s(T)}{M_s(0)}\right]^2 + \left(K_v(0) + \frac{K_s(0)}{d}\right)\left[\frac{M_s(T)}{M_s(0)}\right]^3$$

In this expression, the first term reflects the volumetric shape anisotropy which favors an in-plane magnetization orientation. The second term corresponds to the sum of a volumetric anisotropy of magnetocrystalline origin and an interfacial anisotropy which favors an out-of-plane orientation of the magnetization for the materials considered. In view of the interfacial character contained in the second term, the relative weight of the two terms depends on the thickness of the ferromagnetic storage layer. As, furthermore, these two terms have different temperature dependencies, this means that that magnetization switching temperature given by the temperature at which the two terms are equal, depends on the thickness of the ferromagnetic layer.

The magnetic storage layer may also consist of the combination of an additional ferromagnetic layer which, if it were alone, would have a planar magnetization, in exchange interaction with a layer or a multilayer having an out-of-plane magnetization. It may, for example, be a layer of CoFeB or CoFe alloys having a thickness of 1 to 3 nm in exchange interaction with a layer or multilayer having an out-of-plane anisotropy (such as TbCo or (Pt/Co)). If the perpendicular anisotropy of the out-of-plane magnetization layer is sufficiently strong at the standby temperature, and if the exchange interaction between these two layers is sufficiently strong (planar magnetization layer if it were alone and out-of-plane magnetization layer), then the magnetization of the additional layer can be drawn out-of-plane by the perpendicular magnetization layer at the standby temperature. Also in this case, since the out-of-plane anisotropy of the perpendicular magnetization layer decreases as a function of temperature, the magnetization of the additional layer switches into the plane at a certain temperature, which can be adjusted by adjusting the composition of the layers and also their thickness. The advantage of adding the additional layer is that it serves to reinforce the spin polarization of the electrons in the neighborhood of the tunnel barrier.

Furthermore, the fixed magnetization layer 50 and the switchable magnetization storage layer 51 are separated by a nonmagnetic spacer 52. The latter may be:

preferably, an insulating tunnel barrier (for example made from alumina or MgO or $TiO_x$ or $HfO_x$ or $TaO_x$ or $SrTiO_x$ having a typical thickness between 0.4 nm and 3 nm). In this case, the magnetic element resulting from this stack has a tunnel magnetoresistance effect;

an insulating layer perforated with conducting paths (such as the spacers known to a person skilled in the art in structures called confined-current-path structures). These spacers consist of small conducting holes inside insulating layers. They are prepared for example by depositing a thin layer of $Al_{1-x}Cu_x$ alloys which is oxidized like a tunnel barrier. The aluminum captures the oxygen and is converted to alumina while the copper segregates into small clusters forming conducting paths through the oxide barrier. The element resulting from this stack has a giant magnetoresistance effect characteristic of these confined-current-path (CCP) structures;

a semiconducting layer (for example made from Si, Ge, GaAs having a typical thickness between 0.5 nm and 10 microns). The element resulting from this stack has a tunnel or giant magnetoresistance effect according to the thickness and electronic structure of the spacer;

a metal layer (for example of copper or gold, having a typical thickness of between 1 nm and 10 nm). The magnetic element resulting from this stack has a giant magnetoresistance effect.

The combination consisting of the fixed magnetization layer 50, the nonmagnetic spacer 52, and the switchable magnetization layer 51 (with anisotropy reversal) constitutes the core of the stack described in the present invention.

Various improvements can be made to this basic stack:

The replacement of the fixed magnetization layer by a layer called a synthetic antiferromagnetic pinned layer has already been described above, said layer can be pinned by exchange interaction with an antiferromagnetic layer.

Figure 4:
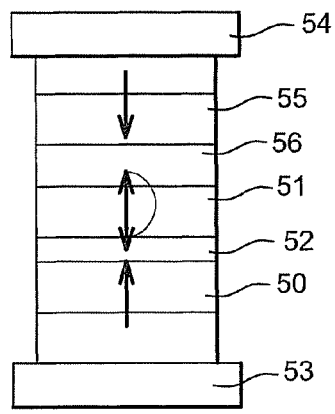
FIG. 4 is a similar view to FIG. 3, of a second embodiment of the invention, using a reference pinned layer and an additional pinned layer.
Figure 5:
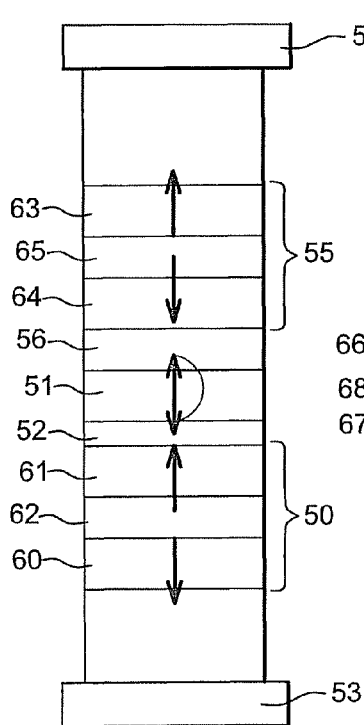
FIG. 5 is a similar view to FIG. 4, in which the two pinned layers each consist of a synthetic antiferromagnetic layer.

In the case in which the magnetization switching of the layer 51 exploits the spin transfer mechanism and if the nonmagnetic spacer 52 is nonmetallic, it is then advantageous to add, at the contact of the switchable magnetization layer 51, on the side opposite the nonmagnetic spacer 52 previously described separating the switchable magnetization layer from the fixed magnetization layer 50, a second nonmagnetic spacer 56, preferably metallic (for example made from copper having a typical thickness of 2 to 5 nm) or having a lower electrical resistance than the first nonmagnetic spacer 52, said second spacer 56 being itself in contact with a second fixed magnetization layer 55 oriented out-of-plane throughout the operating temperature range of the device (see FIG. 4). This second pinned layer 55 has the same composition as the first pinned layer 50. The magnetization of this second layer must be oriented antiparallel to the first pinned layer. The advantage of introducing this second fixed magnetization layer 55 is to reinforce the spin transfer effect at the switchable magnetization layer 51 by cumulating the spin transfer generated by the two pinned layers. This spin transfer reinforcement effect is described for example in document U.S. Pat. No. 6,385,082. On the other hand, since the electrical resistance of the first spacer 52 (nonmetallic) is higher than the electrical resistance of the second spacer 56, the magnetoresistance of the stack is dominated by the contribution of the sandwich formed by the first fixed magnetization layer 50, the first nonmetallic nonmagnetic spacer 52, and the switchable magnetization layer 51. It is interesting to observe that in addition to reinforcing the spin transfer effect, a second advantage of the introduction of this second fixed magnetization layer 55 is to permit a good compensation of the magnetostatic field radiated by the two fixed magnetization layers on the switchable magnetization layer. In fact, if the two fixed magnetization layers 50, 55 have comparable magnetic moments and are at comparable distances from the switchable magnetization layer 51, they produce a virtually opposite radiated field at the switchable magnetization layer, and said field is therefore compensated at this layer. This is advantageous because the magnetostatic field radiated by the pinned layer 50 could hinder the action of the spin transfer or the magnetic field applied during the writing by influencing the orientation of the switchable magnetization toward the upper or lower hemisphere. Furthermore, as for the first fixed magnetization layer 50, this second fixed magnetization layer 55 may consist of a synthetic antiferromagnetic layer, that is formed of two out-of-plane antiparallel magnetization layers 63, 64 maintained in antiparallel alignment by interaction through an appropriate coupling layer 65, for example of ruthenium having a thickness of 0.6 nm to 0.9 nm (FIG. 5). In this case, it is the magnetization of the layer 64 closest to the switchable magnetization layer 51 that must be oriented antiparallel to the magnetization of the first pinned layer closest to the switchable magnetization. Moreover, in order to reinforce the pinning of said second pinned layer, it must be placed in exchange interaction with an adjacent antiferromagnetic layer. The overall structure of the two synthetic antiferromagnetic pinned layers pinned by antiferromagnetic layers is shown in FIG. 5.

Figure 6:
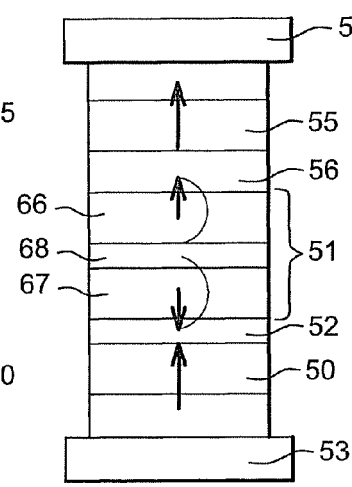
FIG. 6 is a similar view to FIG. 4, in which the storage layer consists of a synthetic antiferromagnetic layer.
Figure 7:
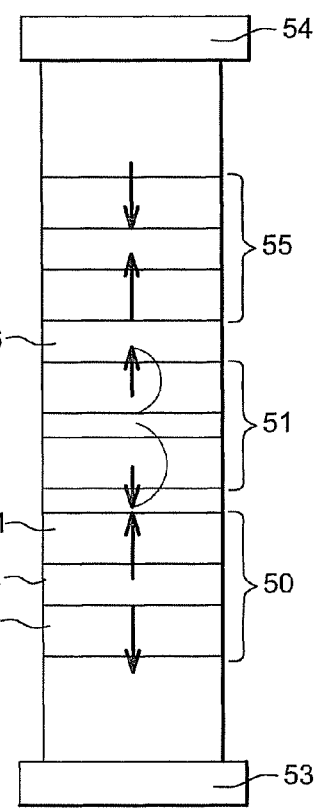
FIG. 7 is a similar view to FIG. 4, in which the two pinned layers and the storage layer consist of synthetic antiferromagnetic layers.

In order to minimize the effect of the magnetostatic field radiated by the pinned fixed magnetization layer during the writing process, it may also be advantageous to use a switchable magnetization layer 51 consisting of a synthetic antiferromagnetic layer. This consists of two ferromagnetic layers 66, 67 coupled antiferromagnetically through an appropriate coupling layer 68 such as ruthenium having a thickness of 0.6 nm to 0.9 nm. The structure proposed is shown in FIG. 6. The advantage of using a synthetic antiferromagnetic switchable magnetization layer is to compensate for the effects of the fields radiated by the two pinned fixed magnetization layers 50, 55. In fact, since the two layers 66, 67 constituting the soft synthetic antiferromagnetic layer have opposite magnetizations, the action of the fields radiated by the two fixed magnetization layers 50, 55 are compensated in the switchable magnetization sandwich. As previously, in the case in which the writing occurs by spin transfer, it is possible to reinforce the spin transfer on the switchable magnetization by adding to the basic structure a second spacer 56 having a lower resistance than the first spacer 52 and a second pinned layer 55 of which the magnetization this time is parallel to the magnetization of the first pinned layer 50. The effect of reinforcing the spin transfer on a synthetic antiferromagnetic layer by adding a second pinned parallel magnetization layer to a first pinned layer is described for example in document U.S. Pat. No. 6,603,677. As previously, one or the other or both of the pinned layers may be replaced by synthetic antiferromagnetic pinned layers, which may themselves be pinned by antiferromagnetic layers. FIG. 7 shows the case in which the two pinned layers are replaced by synthetic antiferromagnetic pinned layers coupled to antiferromagnetic layers.

In order to minimize the electrical current required to heat the structure at the time of writing, it may be advantageous to introduce thermal barriers into the structure to reduce the diffusion of heat toward the electrodes. This has been described for example in document EP-A-1 671 330. These thermal barriers can be made from BiTe, from chalcogenide materials such as GeSbTe, of β-Ta or fabricated by introducing laminated multilayers such as (Ta/Cu) by taking advantage from the high electrical and thermal resistance introduced by the interfaces.

According to a first write embodiment of the invention, a temperature rise is first caused in the storage layer 51 by injecting a current into the stack of the magnetic element, until the orientation of the magnetization of said layer is changed from substantially perpendicular to in the plane of said layer. Then, a magnetic field is applied by positioning horizontal conducting lines 70, 71 (see FIG. 8) in the neighborhood of the storage layer. These lines are offset in position on the side of the memory points to promote the appearance of a vertical component of the field at the storage layer of the memory point concerned. The two lines 70, 71 located on either side of each memory point can be supplied simultaneously with two opposite current pulses to provide two contributions which add to the magnetic field created by these lines. This is advantageous in terms of power consumption, because the write current in each of the lines can be reduced by a factor of 2 compared with the case in which a single line is supplied to create an equivalent magnetic field. The power consumption is then reduced by a factor of 2.

According to the second write embodiment of the invention, here also, a temperature rise is first caused in the storage layer 51 by injecting a current into the stack of the magnetic element, until the orientation of the magnetization of said layer is changed from substantially perpendicular to in the plane of said layer. In this configuration, a magnetic layer having a fixed magnetization oriented out-of-plane is used as the second electrode of the magnetic tunnel junction. This second embodiment is basically more advantageous than the first, because it offers a better evolution in the properties at a decreasing size because there is no longer any need to apply a magnetic field.

Figure 9A:
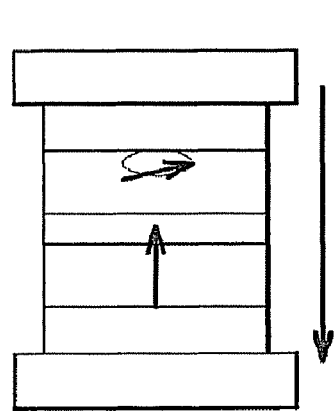
FIGS. 9a to 9d are schematic representations intended to illustrate the writing of a memory point of the invention according to a second embodiment using a spin polarized electric current.

If the electric current flows from the storage layer 51 toward the fixed magnetization layer 50, the electrons then flow from the fixed magnetization layer to the storage layer (FIG. 9a). The electrons issuing from the fixed magnetization layer oriented out-of-plane then have an out-of-plane spin polarization in the same direction as the magnetization of the fixed magnetization layer. These electrons, by penetrating into the storage layer, of which the magnetization has become planar under the effect of the temperature rise, exert a spin transfer torque which tends to draw the magnetization of this storage layer out-of-plane in the spin polarization direction of the electrons injected into this layer. The magnetization dynamics induced by the injection of an out-of-plane polarized current into a planar magnetization layer has been described in the following articles: D. Houssamedine et al, Nature Materials 6, 447 (2007); Lee, K. J., Redon, O. & Dieny, B. *Analytical investigation of spin-transfer dynamics using a perpendicular-to-plane polarizer, Appl. Phys. Lett.* 86, 22505-22507 (2005); Kent, A. D., Ozyilmaz, B. & del Barco, E. *Spin-transfer-induced precessional magnetization reversal, Appl. Phys. Lett.* 84, 3897-3899 (2004).

Figure 9B:
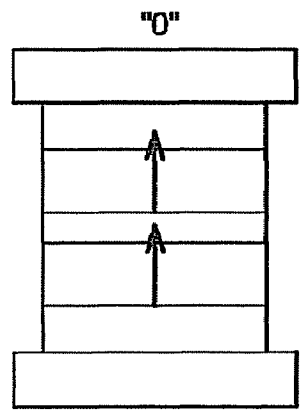

In these articles, it has been demonstrated that under the combined effect of the spin transfer torque and the out-of-plane demagnetizing field applied to the magnetization of the storage layer, the magnetization of said layer is drawn out-of-plane into the upper or lower hemisphere according to the current direction. Within a broad range of current densities, the magnetization precesses on a cone having an out-of-plane axis parallel to the spin current bias direction. The angle formed by the magnetization of the storage layer to the normal to the plane and the precession frequency depend on the current density as shown in the preceding publications. At higher current density, the magnetization may acquire a stable out-of-plane position. However, what is important for the present invention is specifically the fact that the magnetization exits the plane under the effect of the spin transfer to pass into the hemisphere of which the axis has the same direction as the magnetization of the fixed magnetization layer (FIG. 9b).

Figure 9C:
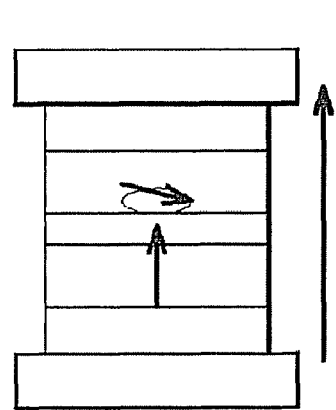
Figure 9D:
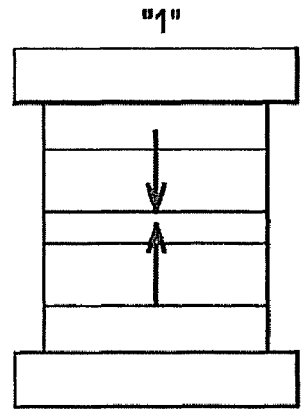

If the electric current flows from the fixed magnetization layer 50 toward the storage layer 51 (FIG. 9c), then the electrons flow from the storage layer to the fixed magnetization layer. The magnetization of the storage layer 51 is then drawn out-of-plane in the antiparallel direction with respect to the magnetization direction of the fixed magnetization layer. As in the previous case, the magnetization may enter precession by describing a cone whereof the axis is antiparallel to the magnetization direction of the fixed magnetization layer. However, what is important for the present invention is specifically the fact that the magnetization exits the plane under the effect of the spin transfer to pass into the hemisphere of which the axis is antiparallel to the magnetization of the fixed magnetization layer (FIG. 9d).

The current densities involved in this phenomenon are in the range from a few $10^5$ A/cm$^2$ to a few $10^6$ A/cm$^2$. They are perfectly compatible with the current densities which can be withstood by the magnetic tunnel junctions having a resistance*product between ~1 Ω·µm$^2$ and a few tens of Ω·µm$^2$. They are also approximately the same or slightly lower than the current densities required for heating.

Figure 8:
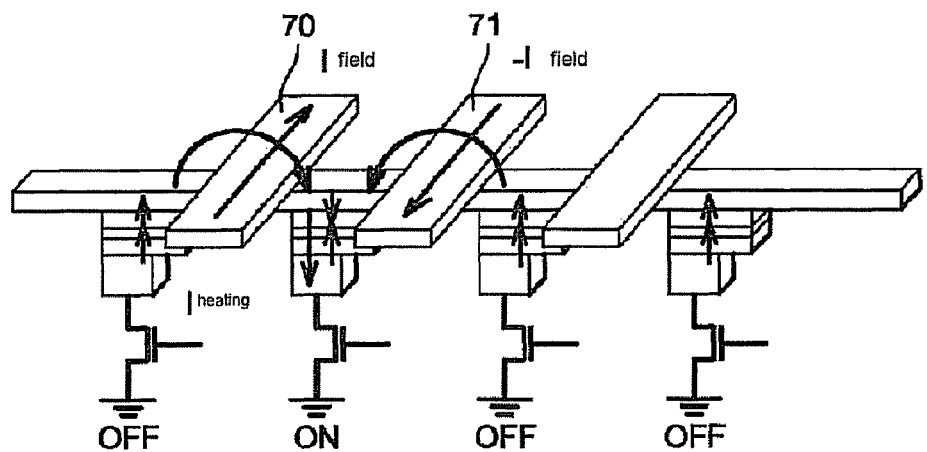
FIG. 8 is a schematic representation intended to illustrate the writing of a memory point according to the invention in a first embodiment using the application of a magnetic field.

The process of writing data in the stack according to the second embodiment and shown in FIGS. 8 and 9 is carried out in the preferable case in which the stack is a magnetic tunnel junction. Without jeopardizing the generality, it is assumed for the discussion that the fixed magnetization layer 50 has its magnetization oriented upward as shown in FIG. 8. A person skilled in the art would have little difficulty in transcribing this discussion to the case in which the magnetization of the fixed layer is downward.

To write a "0" or a logic "1", a current pulse is sent through the stack from top to bottom or bottom to top as shown in FIG. 9a, top line. This current pulse has several combined effects:
on the one hand, initially, it causes a heating of the stack by Joule effect in the structure. In the case of a tunnel junction, the generation of heat is essentially located at the tunnel barrier and diffuses toward the electrodes which connect the junction to its base and to its top. The current density is selected so that the temperature rise in the storage layer is about ΔT=100 to 220° C. and this temperature rise, for the material constituting the storage layer, causes a reversal of the anisotropy from out-of-plane to planar.
on the other, the current passing through the storage layer 51 having an out-of-plane spin polarization due to the presence of the fixed magnetization layer 50, it exerts a spin transfer torque on the magnetization which draws the magnetization of the storage layer into the upper or lower hemisphere depending on the current direction as shown in FIG. 9.
after its maximum, the current density then decreases progressively (typically in a few nanoseconds) to be cancelled a few nanoseconds later. During this period, the temperature goes through a peak and then decreases to return to the standby temperature in typically 5 to 30 ns. This cooling period depends on the specific heat of the column and the thermal diffusion constants of the various elements constituting the stack and in particular on the presence or absence of thermal barriers between the storage layer and the upper conducting line (see FIG. 9) and between the fixed magnetization layer and the lower conducting line (see FIG. 9). Due to the cooling of the storage layer, the latter tends to recover its out-of-plane anisotropy. Accordingly, if the spin transfer tends to draw the magnetization of the storage layer into the upper hemisphere, the magnetization of the storage layer is oriented during the cooling substantially along the normal to the plane of the layer and upward. On the contrary, if the spin transfer tends to draw the magnetization of the storage layer into the lower hemisphere, the magnetization of the storage layer is then oriented during the cooling substantially along the normal to the plane of the layer and downward.

The advantage of this second embodiment of the present invention over the prior art is that the current densities required here for magnetization switching are lower than when using stacks with an out-of-plane magnetization but do not have these magnetization reorientations (as described for example in the article by S. Mangin, D. Ravelosona, J. Katine, B. Terris, and E. E. Fullerton, Nat. Mater. 5, 210 (2006)). In fact, in the present invention, the role of the spin transfer is not to cause the complete upward or downward switching starting with a state in which the magnetization is oriented downward or upward. Here, the role of the spin transfer is to draw the magnetization slightly into the upper hemisphere or into the lower hemisphere starting with a situation in which the magnetization is virtually in the plane. This latter situation requires much lower current densities than in the previous one. The current density required for writing is therefore essentially determined by the heating current density required to cause the anisotropy reorientation of the storage layer from out-of-plane to planar. In heat assisted write memories, it is known that the heating current density can be significantly reduced (to values of about a few $10^5$ A/cm$^2$) by adjusting the thermal properties of the stack, particularly by minimizing the thickness of the layers involved in the active part of the stack from the magnetoresistance standpoint (that is the reference layer/tunnel barrier/storage layer sandwich) and by introducing layers having low thermal conductivity playing the role of thermal barriers in the stack between this active part and the current intake electrodes located at the top and the base of the magnetoresistive pillar.

FIG. 10 shows an example of a characteristic stack of the invention, serving to obtain the anisotropy switching previously described.

The storage layer, of which the magnetization is intended to switch, consists here of a (Co/Pt/Ni/Pt) multilayer, of which the anisotropy is out-of-plane at ambient temperature, and decreases as the temperature rises, coupled with a 1.8 nm thick CoFeB layer, which, if it were alone (in other words, in the absence of coupling), would have its magnetization in the plane. Due to its coupling by exchange interaction with the (Co/Pt/Ni/Pt) multilayer, its magnetization is out-of-plane at ambient temperature.

FIG. 10 shows the cycles measured with a magnetic field applied out-of-plane at various temperatures to a stack of the abovementioned type, and more precisely to the following stack:
$Ta_{3\ nm}/Pt_{20\ nm}/(Co_{0.45\ nm}/Pt_{0.6\ nm}/Ni_{0.5\ nm}/Pt_{0.6\ nm})_3/CoFeB_{1.8\ nm}/Cu_{2\ nm}/Pt_{2\ nm}$
which has been annealed at 350° C. to stabilize the structure and crystallize the tunnel barrier.

When the cycles have a substantially square shape with a residual magnetization (that is, at zero field) close to the saturation magnetization, this means that the magnetization is out-of-plane. This is the case in particular for the cycles carried out at ambient temperature and at 50° C.

On the contrary, when the cycles <<rest>> with a zero magnetization for a zero field (M=0 and H=0), in particular for a temperature of 140° C. or more, this means that the magnetization is completely planar.

The switching of the magnetic anisotropy of the system is thus very clearly observed, from completely out-of-plane below 50° C. to completely in-plane above 140° C. The switching is progressive between these two temperatures.

The invention claimed is:

1. A magnetic element which can be written by thermally assisted magnetic field or by thermally assisted spin transfer, comprising a stack consisting of:
 a free magnetic storage layer, of which the magnetization direction is switchable between two nonwrite stable states, both directed out-of-plane and substantially perpendicular to the plane of said layer, and of which the magnetization is spontaneously reoriented from out-of-plane and substantially perpendicular to the plane to substantially in the plane under the effect of a rise in temperature during the writing;
 at least one reference magnetic pinned layer, of which the magnetization is oriented substantially perpendicular to the plane of said layer;
 a nonmagnetic spacer inserted between the two layers;
 means for making an electric current flow perpendicular to the plane of said layers.

2. A magnetic element for writing by thermally assisted magnetic field or by thermally assisted spin transfer as claimed in claim 1, wherein the storage layer is made from a magnetic alloy such as FePt, FePd, CoPt, CoPd, or from a rare earth-transition metal alloy such as TbFe, TbCo.

3. A magnetic element for writing by thermally assisted magnetic field or by thermally assisted spin transfer as claimed in claim 1, wherein the storage layer is made from a multilayer or a combination of multilayers based on Co, Ni, Fe, Pt, Pd, Cr.

4. A magnetic element for writing by thermally assisted magnetic field or by thermally assisted spin transfer as claimed in claim 1, wherein the storage layer consists of a combination of two ferromagnetic layers in exchange interaction, one having a high out-of-plane anisotropy, the other which would have a planar magnetization if it were alone but which, by exchange interaction with the first, has its magnetization drawn out-of-plane at the standby, nonwrite, temperature.

5. A magnetic element for writing by thermally assisted magnetic field or by thermally assisted spin transfer as claimed in claim 1, wherein the storage layer is a synthetic antiferromagnetic layer.

6. A magnetic element for writing by thermally assisted magnetic field or by thermally assisted spin transfer as claimed in claim 1, wherein the pinned layer consists of a multilayer based on at least two elements selected from Pt, Pd, Co, Ni, the alloys $Co_{1-x-y}Fe_xNi_y$, with x+y<50%.

7. A magnetic element for writing by thermally assisted magnetic field or by thermally assisted spin transfer as claimed in claim 1, wherein the pinned layer consists of a multilayer formed of a magnetic transition metal/oxide.

8. A magnetic element for writing by thermally assisted magnetic field or by thermally assisted spin transfer as claimed in claim 1, wherein the pinned layer consists of a multilayer made on the basis of ordered alloys FePt, FePd, CoPt, CoPd, CoCr, or rare earth/transition metal.

9. A magnetic element for writing by thermally assisted magnetic field or by thermally assisted spin transfer as claimed in claim 1, wherein the pinned layer further comprises a thin ferromagnetic layer inserted between the pinned layer and the non-magnetic spacer for reinforcing the amplitude of the magnetoresistance of the magnetic element and the current bias.

10. A magnetic element for writing by thermally assisted magnetic field or by thermally assisted spin transfer as claimed in claim 1, wherein the pinned layer consists of a synthetic antiferromagnetic layer.

11. A magnetic element for writing by thermally assisted magnetic field or by thermally assisted spin transfer as claimed in claim 1, wherein the pinned layer is in exchange interaction with a pinned antiferromagnetic layer, such as PtMn, IrMn, or PtPdMn.

12. A magnetic element for writing by thermally assisted magnetic field or by thermally assisted spin transfer as claimed in claim 1, wherein the stack comprises a second pinned layer, separated from the storage layer by a second spacer.

13. A magnetic element for writing by thermally assisted magnetic field or by thermally assisted spin transfer as claimed in claim 12, wherein the second pinned layer is a synthetic antiferromagnetic layer.

14. A magnetic element for writing by thermally assisted magnetic field or by thermally assisted spin transfer as claimed in claim 12, wherein the second pinned layer is in exchange interaction with an antiferromagnetic layer such as PtMn, IrMn, PtPdMn.

15. A magnetic element for writing by thermally assisted magnetic field or by thermally assisted spin transfer as claimed in claim 12, wherein the second pinned layer has its magnetization antiparallel to that of the first pinned layer.

16. A magnetic element for writing by thermally assisted magnetic field or by thermally assisted spin transfer as claimed in claim 12, wherein the second pinned layer has its magnetization parallel to that of the first pinned layer.

17. A magnetic element for writing by thermally assisted magnetic field or by thermally assisted spin transfer as claimed in claim 1, wherein the nonmagnetic spacer is an insulating tunnel barrier selected from the group comprising alumina, MgO, $SrTiO_3$, $TiO_x$, $HfO_x$, $TaO_x$, or semiconducting tunnel barrier selected from the group comprising (Si, Ge, GaAs).

18. A magnetic element for writing by thermally assisted magnetic field or by thermally assisted spin transfer as claimed in claim 1, wherein the nonmagnetic spacer is a confined-current-path insulating layer selected from the group comprising AlCuOx, MgCuOx, HfCuOx, TaCuOx.

19. A magnetic element for writing by thermally assisted magnetic field or by thermally assisted spin transfer as claimed in claim 1, wherein the nonmagnetic spacer is a metal layer such as Cu or Au.

20. A magnetic element for writing by thermally assisted magnetic field or by thermally assisted spin transfer as claimed in claim 12, wherein the nonmagnetic spacer has a higher electrical resistance than the second nonmagnetic spacer.

21. A magnetic element for writing by thermally assisted magnetic field or by thermally assisted spin transfer as claimed in claim 1, wherein the stack further comprises heat barriers selected from the group consisting of BiTe, chalcogenides, β-Ta, and Ta/Cu laminated multilayers.

22. A method for carrying out the writing of memory points or logic devices based on magnetic elements as claimed in claim 1, wherein each write phase is accompanied by a rise in temperature of the addresses memory point above the anisotropy reorientation temperature of the magnetization of the storage layer by sending a current pulse into a conducting line associated with the addresses memory point and thereby to reorient the magnetization of the storage layer from an out-of-plane orientation substantially perpendicular to the plane of said layer to an orientation substantially in the plane of the layer, and of the application of a magnetic field directed upward or downward with regard to the plane of the layers constituting said memory element, and further of the interruption of the heating current so that the magnetization cools under the effect of said magnetic field by reorienting substantially along the normal to the plane of the layers upward or downward.

23. A method for carrying out the writing of memory points or logic devices based on magnetic elements as claimed in claim 1, wherein each write phase is accompanied by a rise in temperature of the addresses memory point above the anisotropy switching temperature of the magnetization of the storage layer by sending a current pulse into a conducting line associated with the addressed memory point and thereby to reorient the magnetization of the storage layer from an out-of-plane orientation substantially perpendicular to the plane of said layer to an orientation substantially in the plane of the layer, followed by the decrease and cancellation of said current, the injected electric current being spin polarized and flowing from the first pinned layer to the storage layer or in the opposite direction, and applying a torque by spin transfer to the magnetization of said storage layer, the spin polarization of said current causing the orientation of the magnetization of said layer upward or downward with regard to the plane of the layers constituting said magnetic element according to the direction of said current.

24. A heat assisted magnetic write memory of which each memory point consists of a magnetic element as claimed in claim 1.

25. A heat assisted logic write element consisting of a magnetic element as claimed in claim 1.

* * * * *